United States Patent
Chang et al.

(10) Patent No.: US 10,373,957 B2
(45) Date of Patent: Aug. 6, 2019

(54) CAPACITOR STRUCTURE AND FABRICATION METHOD THEREOF

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW); Yi-Wang Zhan, Taichung (TW); Chieh-Te Chen, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

(*) Notice: Subject to any disclaimer, the term of this patent is extended or adjusted under 35 U.S.C. 154(b) by 0 days.

(21) Appl. No.: 15/856,084

(22) Filed: Dec. 28, 2017

(65) Prior Publication Data

US 2018/0190657 A1 Jul. 5, 2018

(30) Foreign Application Priority Data

Dec. 30, 2016 (CN) .......................... 2016 1 1252356

(51) Int. Cl.
*H01L 27/108* (2006.01)
*H01L 21/311* (2006.01)
*H01L 21/02* (2006.01)
*H01L 49/02* (2006.01)

(52) U.S. Cl.
CPC .... *H01L 27/10814* (2013.01); *H01L 21/0217* (2013.01); *H01L 21/02532* (2013.01); *H01L 21/02592* (2013.01); *H01L 21/31116* (2013.01); *H01L 27/10852* (2013.01); *H01L 27/10855* (2013.01); *H01L 28/91* (2013.01)

(58) Field of Classification Search
CPC ......... H01L 27/10814; H01L 27/10852; H01L 27/10855
See application file for complete search history.

(56) References Cited

U.S. PATENT DOCUMENTS

| 6,242,332 | B1* | 6/2001 | Cho | .................. H01L 21/76897 257/E21.507 |
| 2010/0187588 | A1* | 7/2010 | Kim | .................. H01L 27/10817 257/306 |
| 2015/0060970 | A1 | 3/2015 | Sasaki | |

* cited by examiner

*Primary Examiner* — Douglas M Menz
(74) *Attorney, Agent, or Firm* — Winston Hsu

(57) ABSTRACT

A capacitor structure includes a semiconductor substrate, a dielectric layer disposed on the semiconductor substrate, a storage node pad disposed in the dielectric layer, and a cylindrical lower electrode including a bottom portion recessed into the dielectric layer and in contact with the storage node pad. The bottom extends to a sidewall of the storage node pad.

12 Claims, 4 Drawing Sheets

CAPACITOR STRUCTURE AND FABRICATION METHOD THEREOF

CROSS REFERENCE TO RELATED APPLICATION

This application claims the priority from CN application No. 201611252356.x, filed Dec. 30, 2016 which is included in its entirety herein by reference.

BACKGROUND OF THE INVENTION

1. Field of the Invention

The present invention relates generally to a semiconductor device. More particularly, the present invention relates to a capacitor structure of a dynamic random access memory (DRAM) device and a method for making the same.

2. Description of the Prior Art

Capacitors for dynamic random access memory (DRAM) devices are getting smaller and smaller as semiconductor process technology advances. In order to minimize the chip area occupied by each capacitor, but also to maintain a certain capacitance value, the current trend is to make the capacitor high and thin.

Common capacitors are so-called cylindrical container storage node devices, which are fabricated by firstly etching a high aspect ratio opening in a template layer to reveal the underlying storage node pad. A conductive layer is then deposited uniformly within the high aspect ratio openings. Then, the template layer is removed. The capacitor dielectric material and the capacitor upper electrode are sequentially formed on the container-shaped conductive layer.

As the critical dimension continues to decrease, misalignment or overlay errors of lithography tends to result in insufficient process window in etching the above-described openings having high aspect ratios, which is the problem to be overcome in this technical field.

SUMMARY OF THE INVENTION

The present invention discloses an improved capacitor structure and manufacturing method, which can solve the above shortcomings and disadvantages of the prior art.

One embodiment of the invention provides a capacitor structure including a semiconductor substrate, a dielectric layer disposed on the semiconductor substrate, a storage node pad disposed in the dielectric layer, and a cylindrical lower electrode. The cylindrical lower electrode includes a bottom portion recessed into the dielectric layer and in contact with the storage node pad. The bottom extends to a sidewall of the storage node pad.

The bottom portion includes a first horizontal segment disposed on a top surface of the storage node pad, and a second horizontal segment located on the dielectric layer. The second horizontal segment is lower than the first horizontal segment. The bottom portion further comprises a vertical segment disposed on the sidewall of the storage node pad and connecting the first horizontal segment and the second horizontal segment.

According to another embodiment of the present invention, a method for fabricating a capacitor structure is provided. First, a semiconductor substrate is provided on which a storage node pad is formed. A dielectric layer is formed on the semiconductor substrate to cover the storage node pad. A template layer is formed on the dielectric layer. A lattice layer is formed on the template layer. A first etching process is performed to etch through the lattice layer and the template layer, and a portion of the dielectric layer is etched to form a first opening. A second etching process is performed to etch the dielectric layer through the first opening to form a second opening exposing a portion of the top surface of the storage node pad. A cylindrical lower electrode is formed in the first opening and the second opening. The lower electrode comprises a bottom portion recessed into the dielectric layer and contacting with the storage node pad. The bottom portion extends to a sidewall of the storage node pad.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
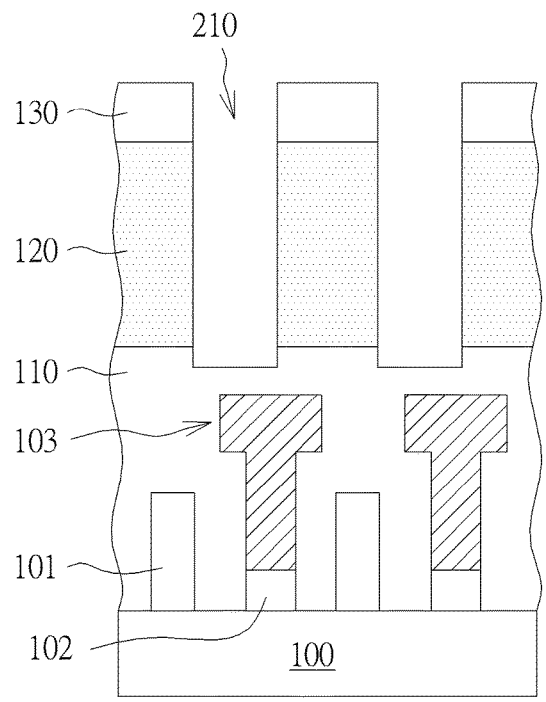
FIG. 1 to FIG. 5 show a method for fabricating a capacitor structure of a dynamic random access memory (DRAM) device according to an embodiment of the present invention.

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

The term "horizontal" as used herein is defined as a plane parallel to the conventional major plane or surface of the semiconductor chip or die substrate, regardless of its orientation. The term "vertical" refers to a direction perpendicular to the horizontal as just defined. Terms, such as "on", "above", "below", "bottom", "top" "side" (as in"w" "h" "w" "v", and "under", are defined with respect to the horizontal plane.

Please refer to FIG. 1 to FIG. 5, which illustrate a method for fabricating a capacitor structure of a dynamic random access memory (DRAM) device according to an embodiment of the present invention. First, as shown in FIG. 1, a semiconductor substrate 100, such as a silicon substrate, is provided. A bit line structure 101 and a contact structure 102 are formed thereon. Each contact structure 102 may have a storage node pad 103 formed thereon. The bit line structure 101, the contact structure 102 and the storage node pad 103 may be covered by a dielectric layer 110.

According to an embodiment of the present invention, the dielectric layer 110 may include silicon nitride, but not limited thereto. Next, a template layer 120 is formed on the dielectric layer 110. According to an embodiment of the present invention, the template layer 120 has a high etching selectivity to the dielectric layer 110, for example, an etching selectivity of more than 30 or more, but is not limited thereto. According to an embodiment of the present invention, the template layer 120 may be made of amorphous silicon. Next, a lattice layer 130, such as a silicon nitride layer, is formed on the template layer 120.

According to an embodiment of the present invention, a first etching process, such as a dry etching process, is performed to etch through the lattice layer 130 and the template layer 120, and a portion of the dielectric layer 110 is etched to form a first opening 210. According to an embodiment of the invention, the first etching process stops on the dielectric layer 110, and the first opening 210 does not expose the storage node pad 103.

Figure 2:
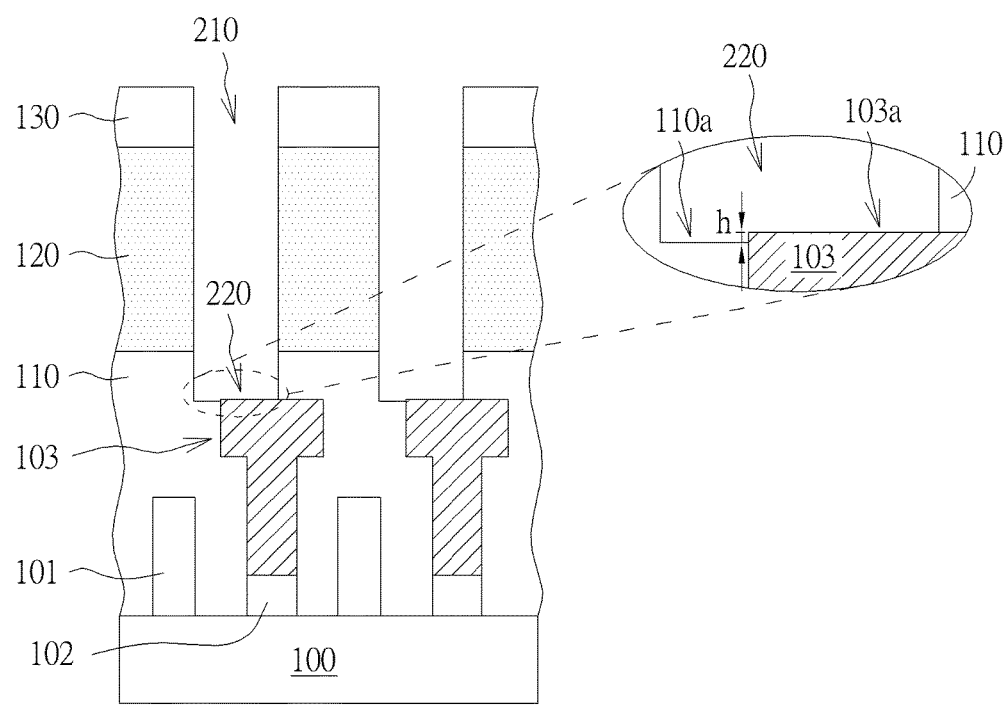

As shown in FIG. 2, a second etching process, such as a dry etching process, is further performed to etch the dielectric layer 110 through the first opening 210 to form a second opening 220 exposing a portion of the top surface of the storage node pad 103. The first opening 210 and the second opening 220 together form a storage node opening.

According to an embodiment of the present invention, the first etching process and the second etching process use different etching gases. For example, the first etching process mainly uses an etching gas containing chlorine (Cl) or hydrogen bromide (HBr), and the second etching process mainly uses an etching gas containing carbon tetrafluoride ($CF_4$).

It can be seen from the partial enlarged view of FIG. 2 that due to the misalignment, the bottom surface of the second opening 220 may be formed by the exposed portion of the top surface 103a of the storage node pad 103 and the exposed surface 110a of the dielectric layer 110 with a step height h between the top surface 103a and the surface 110a. The step height h may be controlled to be less than or equal to 70 angstroms, but is not limited thereto.

Figure 3:
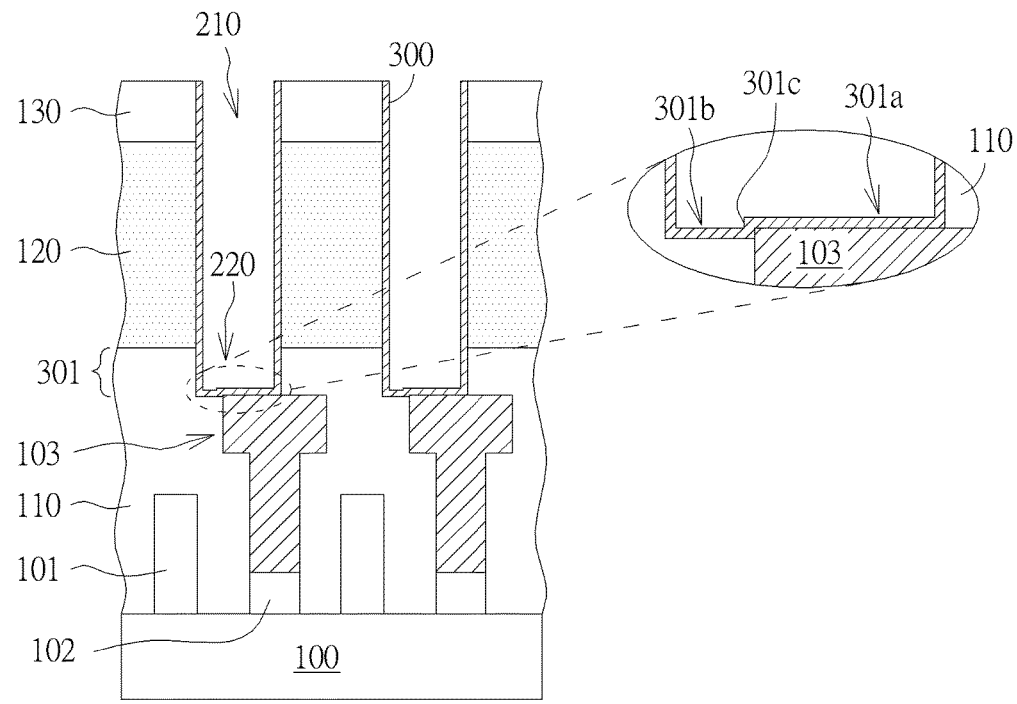

As shown in FIG. 3, a cylindrical lower electrode 300 is then formed in the first opening 210 and the second opening 220. The lower electrode 300 includes a bottom portion 301 recessed into the dielectric layer 110 and in direct contact with the storage node pad 103. The bottom portion 301 extends to a sidewall of the storage node pad 103. According to an embodiment of the present invention, the cylindrical lower electrode 300 may include titanium nitride, but is not limited thereto.

According to an embodiment of the present invention, the bottom portion 301 includes a first horizontal segment 301a disposed on the top surface 103a of the storage node pad 103, a second horizontal segment 103b disposed on the dielectric layer 110. The second horizontal segment 103b is lower than the first horizontal segment 301a. As described above, the step height h between the first horizontal segment 301a and the second horizontal segment 301b can be controlled to less than or equal to 70 angstroms.

According to an embodiment of the present invention, the bottom portion 301 further includes a vertical segment 301c disposed on a sidewall of the storage node pad 103. The vertical segment 301c connects the first horizontal segment 301a with the second horizontal segment 301b.

Figure 6:
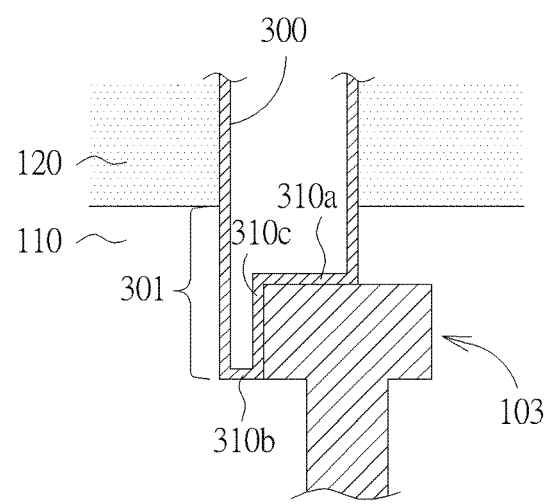
FIG. 6 is a partial enlarged schematic view of the bottom portion of a cylindrical lower electrode according to another embodiment of the present invention.

According to another embodiment of the present invention, as shown in FIG. 6, precise etching control may also be used to fully expose the sidewalls of the storage node pad 103 during the above second etching process. In this way, when forming the lower portion 301 of the cylindrical lower electrode 300, a bottom surface of the second horizontal portion 301b is flush with the bottom surface of the protruding portion of the storage node pad 103. The advantage is that the contact area between the cylindrical lower electrode 300 and the storage node pad 103 can be increased and the resistance can be reduced.

Figure 7:
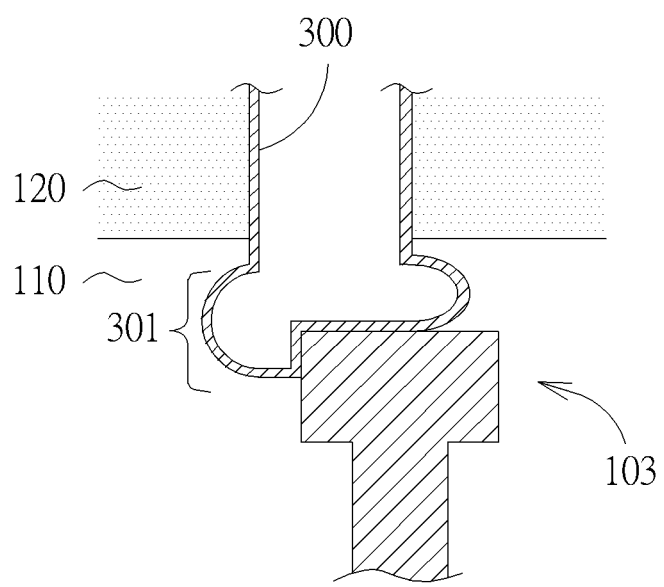
FIG. 7 is a partially enlarged schematic view of the bottom portion of a cylindrical lower electrode according to yet another embodiment of the present invention.

According to another embodiment of the present invention, as shown in FIG. 7, the second etching process may be combined with an anisotropic etching to form a wider width of the bottle-shaped bottom portion 301 of the lower electrode 300 in the dielectric layer 110.

Figure 4:
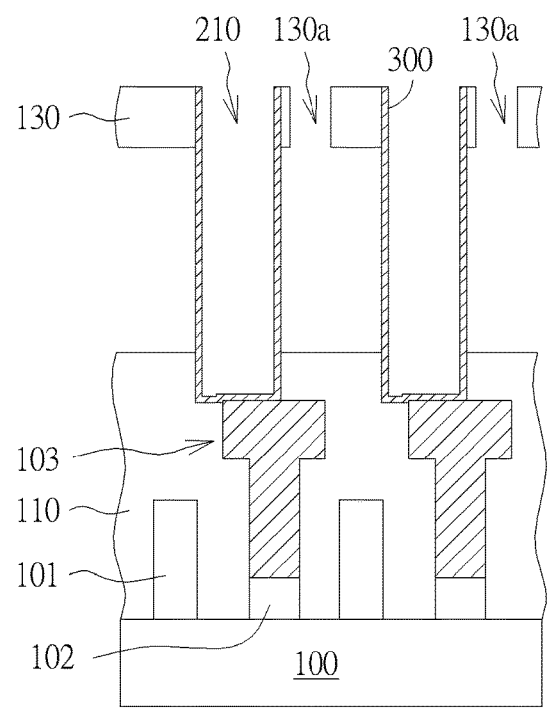

Next, as shown in FIG. 4, a through hole 130a is formed in the lattice layer 130 by a lithography and etching process to expose a part of the template layer 120. Subsequently, an etching process is performed. For example, the template layer 120 is removed by etching with tetramethylammonium hydroxide (TMAH), which leaves the lattice layer 130 and the cylindrical lower electrode 300 intact. Since the cylindrical lower electrode 300 is thin and tall, the lattice layer 130 can support the cylindrical lower electrode 300 in the memory array to avoid collapse.

Figure 5:
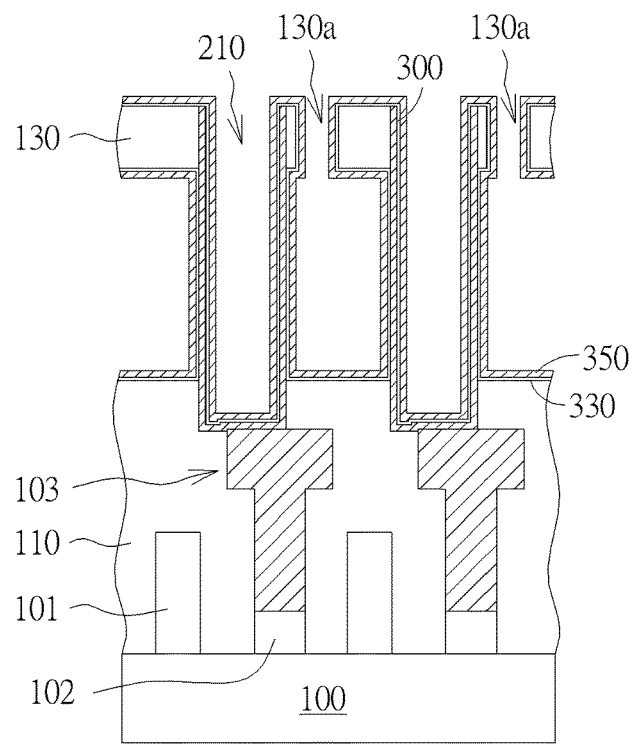

As shown in FIG. 5, a chemical vapor deposition (CVD) process or an atomic layer deposition (ALD) process is performed to form a capacitor dielectric layer 330 on the cylindrical lower electrode 300. According to an embodiment of the present invention, the capacitor dielectric layer 330 may also be deposited on the lattice layer 130 and the dielectric layer 110. Subsequently, a capacitor upper electrode 350 is deposited on the capacitor dielectric layer 330.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A capacitor structure, comprising:
    a semiconductor substrate;
    a dielectric layer on the semiconductor substrate;
    a storage node pad in the dielectric layer, wherein the storage node pad has a T-shaped cross-sectional profile;
    a lower electrode comprising a bottom portion recessed into the dielectric layer and being in direct contact with the storage node pad, wherein the bottom portion extends to a sidewall of the storage node pad; and
    a lattice layer supporting a topmost part of the lower electrode, wherein the lattice layer is not directly contacting the dielectric layer, but is directly contacting the topmost part of the lower electrode.

2. The capacitor structure according to claim 1, wherein the dielectric layer comprises silicon nitride.

3. The capacitor structure according to claim 1, wherein the bottom portion comprises a first horizontal segment disposed on a top surface of the storage node pad and a second horizontal segment disposed on the dielectric layer, wherein the second horizontal segment is lower than the first horizontal segment.

4. The capacitor structure according to claim 3, wherein a step height between the second horizontal segment and the first horizontal segment is less than or equal to 70 angstroms.

5. The capacitor structure according to claim 3, wherein the bottom portion comprises a vertical segment disposed on the sidewall of the storage node pad, wherein the vertical segment connects the second horizontal segment with the first horizontal segment.

6. The capacitor structure according to claim 3, wherein the second horizontal segment has a bottom surface that is coplanar with a bottom surface of a protruding portion of the storage node pad.

7. The capacitor structure according to claim 1, wherein the lattice layer comprises silicon nitride.

8. The capacitor structure according to claim 1 further comprising:
- a capacitor dielectric layer disposed on the lower electrode; and
- a capacitor upper electrode disposed on the capacitor dielectric layer.

9. The capacitor structure according to claim 1, wherein the storage node pad has a T-shaped cross-sectional profile with a straight L-square corner.

10. The capacitor structure according to claim 1, wherein a center line of the lower electrode is not colinear with the center line of the storage node pad along a vertical orientation.

11. The capacitor structure according to claim 1, wherein the bottom portion of the lower electrode is recessed below the top surface of the storage node pad at only on one side of the storage node pad.

12. The capacitor structure according to claim 1, wherein the bottom portion of the lower electrode is in direct contact with only a portion of a top surface of the storage node pad.

* * * * *